United States Patent
Neto et al.

(10) Patent No.: US 11,047,833 B2
(45) Date of Patent: Jun. 29, 2021

(54) METHOD FOR AUTOMATIC DETERMINATION OF TREND IN GRAPHIC ANALYSIS OF TURBOMACHINES

(71) Applicant: PETRÓLEO BRASILEIRO S.A. - PETROBRAS, Rio de Janeiro (BR)

(72) Inventors: Fernando Zampronho Neto, Macaé (BR); Fabio Tristão Marchon, Rio de Janeiro (BR)

(73) Assignee: PETRÓLEO BRASILEIRO S.A.—PETROBRAS, Rio de Janeiro (BR)

( * ) Notice: Subject to any disclaimer, the term of this patent is extended or adjusted under 35 U.S.C. 154(b) by 0 days.

(21) Appl. No.: 16/504,396

(22) Filed: Jul. 8, 2019

(65) Prior Publication Data

US 2020/0049669 A1 Feb. 13, 2020

(30) Foreign Application Priority Data

Jul. 10, 2018 (BR) .......................... 10 2018 01405 4

(51) Int. Cl.
  *G01N 29/24* (2006.01)
  *G01N 29/04* (2006.01)
  *H01L 41/09* (2006.01)

(52) U.S. Cl.
  CPC ....... *G01N 29/2475* (2013.01); *G01N 29/043* (2013.01); *G01N 29/2437* (2013.01); *H01L 41/09* (2013.01)

(58) Field of Classification Search
  CPC ...... B06B 1/0607; G01K 1/00; G01N 29/069; G01N 29/2475; G01N 29/2437;
  (Continued)

(56) References Cited

U.S. PATENT DOCUMENTS 5,195,046 A * 3/1993 Gerardi ................. B64D 15/16
  702/35
5,601,676 A * 2/1997 Zimmerman ....... B29C 66/1142
  156/304.3

(Continued)

FOREIGN PATENT DOCUMENTS

| CN | 101561400 | | 8/2011 |
|---|---|---|---|
| CN | 106596586 | * | 4/2017 |
| ES | 2 368 541 | | 9/2012 |

*Primary Examiner* — Jacques M Saint Surin
(74) *Attorney, Agent, or Firm* — Nixon & Vanderhye P.C.

(57) ABSTRACT

A method for automatic determination of trends in the graphic analysis of turbomachinery, characterized by understanding the steps of: a) obtaining valid data from sensors installed on the turbomachinery for analysis; b) applying fourth order polynomial regression and evaluating its correlation with the sample; c) calculating the relative variation between the first and last points of the series; d) assessing whether the levels of relative variation and relative correlation exceed a previously pre-established minimum level; d1) displaying a non-existent trend result, if the relative variation or the relative correlation does not exceed the minimum level previously established; e) calculating the trend using the weighted average calculations; f) calculating and classifying the rate of change between consecutive values in the valid data series; g) determining parameters for the rate of change; h) checking if the rate of change parameters meet trend criteria, where: h1) if the rate of change parameters meet trend criteria, checking if the relative change is positive, where: h11) if the change relative is positive, displays a positive trend result; and h12) if the relative variation is negative, displays a negative trend result, h2) if the rate of change parameters do not meet trend criteria, checking if the relative variation is positive, where: h21) if the relative variation is negative, shows a result that there is a negative threshold change; and h22) if the relative (Continued)

variation is positive, displays a result that there is a positive threshold change, i) informing the results obtained; and j) taking corrective actions.

3 Claims, 2 Drawing Sheets

(58) Field of Classification Search
CPC ............ G01N 29/2418; G01N 29/043; G01N 2291/0258; G01N 2291/0231; G01W 1/00; H01L 41/09
USPC .......................................................... 73/582
See application file for complete search history.

(56) References Cited

U.S. PATENT DOCUMENTS

| | | | | |
|---|---|---|---|---|
| 7,276,703 | B2* | 10/2007 | Berkcan .............. | G01M 5/0041 |
| | | | | 250/358.1 |
| 2005/0168941 | A1* | 8/2005 | Sokol ................. | H05K 7/20445 |
| | | | | 361/688 |
| 2009/0192729 | A1* | 7/2009 | Pado ................. | G01N 29/2475 |
| | | | | 702/36 |
| 2010/0001620 | A1* | 1/2010 | Yuuya ..................... | C30B 29/32 |
| | | | | 310/336 |
| 2013/0272780 | A1* | 10/2013 | Takeuchi ............ | B29C 66/5326 |
| | | | | 403/270 |
| 2017/0328840 | A1* | 11/2017 | Evans ................. | G01M 5/0016 |

* cited by examiner

METHOD FOR AUTOMATIC DETERMINATION OF TREND IN GRAPHIC ANALYSIS OF TURBOMACHINES

This application claims priority to BR 10 2018 01405 4 filed Jul. 10, 2018, the entire contents of which is hereby incorporated by reference.

FIELD OF THE INVENTION

The present invention involves methods for remote monitoring of the operation of turbomachinery.

FUNDAMENTALS OF THE INVENTION

In the current state of the art, the monitoring of turbomachinery is mainly performed by observing trends by manually using graphical tools by verifying the behavior of the variable in relation to previously registered thresholds. This entire process requires previous experience and knowledge of the operator, in order to avoid false alarms.

Thus, the monitoring of variables of several turbomachines without automated assistance causes operator fatigue, which can cause various diseases due to repetition, in addition to rendering them ineffective if the number of variables is very large, meaning that the operator is unable to identify actual trends due to excessive graphics to be observed.

Some solutions to the problem described are already known from the state of the art. Document U.S. Pat. No. 6,363,332B1, for example, discloses a method for predicting fatigue in a machine comprising a sensor connected to the machine that monitors various parameters of its operation. The sensor sends electrical signals to a monitoring center that also calculates a non-linear trend of the parameters over time to predict possible failure.

The method described in such a document also includes a step for pre-processing sensor data to remove noise, that is, non-representative data.

However, document U.S. Pat. No. 6,363,332B1 does not calculate threshold changes without a trend, which can cause failures to go unnoticed. Additionally, the proposed method performs the same calculation for all registered variables, that is, it does not do data sorting, unnecessarily consuming computational resources.

Document EP1839151B1 which discloses a method of analysis, monitoring and diagnosis of a vacuum pump is also known. The method involves sampling a series of data from the state of variables for different operating conditions. The automatic calculation of trends is done for each data segment, and compared with normal operating states and maximum and minimum values.

However, the method described is not applicable to turbomachinery, either due to the difficulty of adapting to such an application, or due to the absence or difficulty of automation to identify trends.

The document "Application of Trend Detection Methods in Monitoring Physiological Signals" (William W. Melek et al.) describes a comparative study of several trend-detecting methods developed using diffuse logic, statistics and regression techniques. According to William W. Melek et al, a new method that uses the formation of diffuse sets with noise rejection is also revealed, and the techniques presented are applied in physiological monitoring of people.

However, again, the method described does not prove applicable to turbomachinery, either due to the difficulty of adapting to such an application, or due to the absence or difficulty of automation in identifying trends.

Commercial products for monitoring equipment are also known, such as the SIPLUS CMS2000 (Siemens). This system is aimed at predicting equipment failure by monitoring equipment parameters by using sensors. Such a system is dependent on an operator to evaluate each monitored parameter, thus the analysis by the operator can be very time consuming.

Therefore, this system is not applicable to turbomachinery because it causes operator fatigue, when monitoring a large number of variables, reducing the effectiveness of monitoring. In other words, this system allows only a comparison of the value of each variable with pre-registered threshold values, and does not perform trend analysis.

Thus, once again, the proposed system cannot be applied to turbomachinery, as intended by the invention described in the next sections.

As will be described in more detail below, the present invention aims to solve the problems of the state of the art described above in a practical and efficient way.

SUMMARY OF THE INVENTION

The purpose of the present invention is to provide a method for remote monitoring of turbomachinery operation that helps to prevent failures, without requiring the use of an operator to predict failure.

In order to achieve the objectives described above, the present invention provides a method for automatic determination of trends in the graphic analysis of turbomachinery, characterized by understanding the steps of: a) obtaining valid data from sensors installed on the turbomachinery for analysis; b) applying fourth order polynomial regression and evaluating its correlation with the sample; c) calculating the relative variation between the first and last points of the series; d) assessing whether the levels of relative variation and relative correlation exceed a previously pre-established minimum level; d1) displaying a non-existent trend result, if the relative variation or the relative correlation does not exceed the minimum level previously established; e) calculating the trend using the weighted average calculations; f) calculating and classifying the rate of change between consecutive values in the valid data series; g) determining parameters for the rate of change; h) checking if the rate of change parameters meet trend criteria, where: h1) if the rate of change parameters meet trend criteria, checking if the relative change is positive, where: h11) if the relative variation is positive, displays a positive trend result; and h12) if the relative variation is negative, displays a negative trend result, h2) if the rate of change parameters do not meet trend criteria, checking if the relative variation is positive, where: h21) if the relative variation is negative, shows a result that there is a negative threshold change; and h22) if the relative variation is positive, displays a result that there is a positive threshold change, i) informing the results obtained; and j) taking corrective actions.

BRIEF DESCRIPTION OF FIGURES

The detailed description below refers to the attached figures and their respective reference numbers.

DETAILED DESCRIPTION OF THE INVENTION

Preliminarily, note that the description that follows will start from preferred consummation of the invention. As will be apparent to any person skilled in the art, however, the invention is not limited to that particular consummation.

The invention that will be described involves remote monitoring of turbomachinery. Turbomachinery, as known by any technician, can be considered various equipment, such as turbines (aero-derivative or industrial), mechanical transmission systems, natural gas compressors, and electric power generators, among others.

Figure 1:
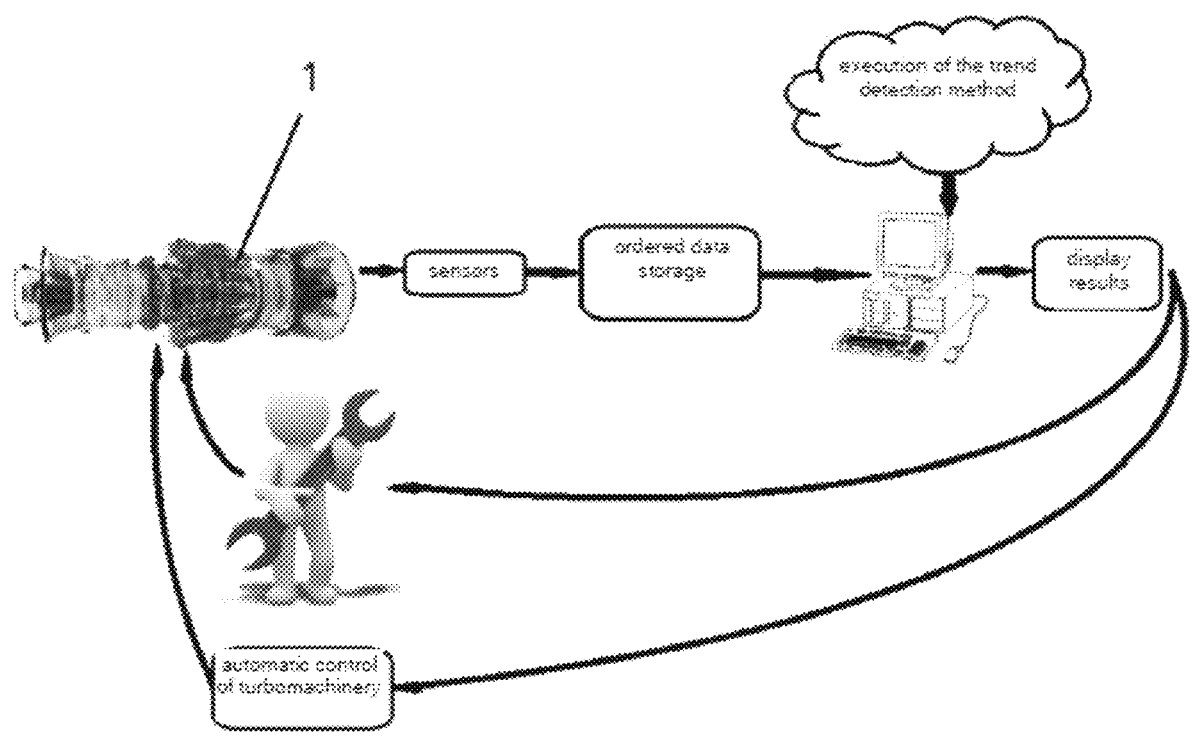
FIG. 1 illustrates a schematic diagram of the application of the method of the present invention.

FIG. 1 illustrates a schematic diagram of the application of the method of the present invention. According to the illustrated diagram, several sensors are connected to any turbomachine 1 that will collect various data related to the operation of turbomachine 1 at different points of it. The data collected may vary according to the application, and information such as temperature, pressure, speed, among others can be collected at different points.

The collected data is stored in a database in communication with a processor. The processor can then analyze the stored data using the method of the invention (which will be described later in this report), detecting a trend that may indicate the possibility of failure.

From this analysis, the results can be displayed, so that a human operator can be instructed to intervene in turbomachine 1, or electronic commands can be sent for automatic control of turbomachinery 1.

It is important to note that, as will be evident from the description below, the proposed method intends to identify only the variables that have some relevant behavior to be observed. Thus, variables that do not show any trends will not be analyzed, optimizing the operator's attention to the really important behavior of the variables under analysis.

Figure 2:
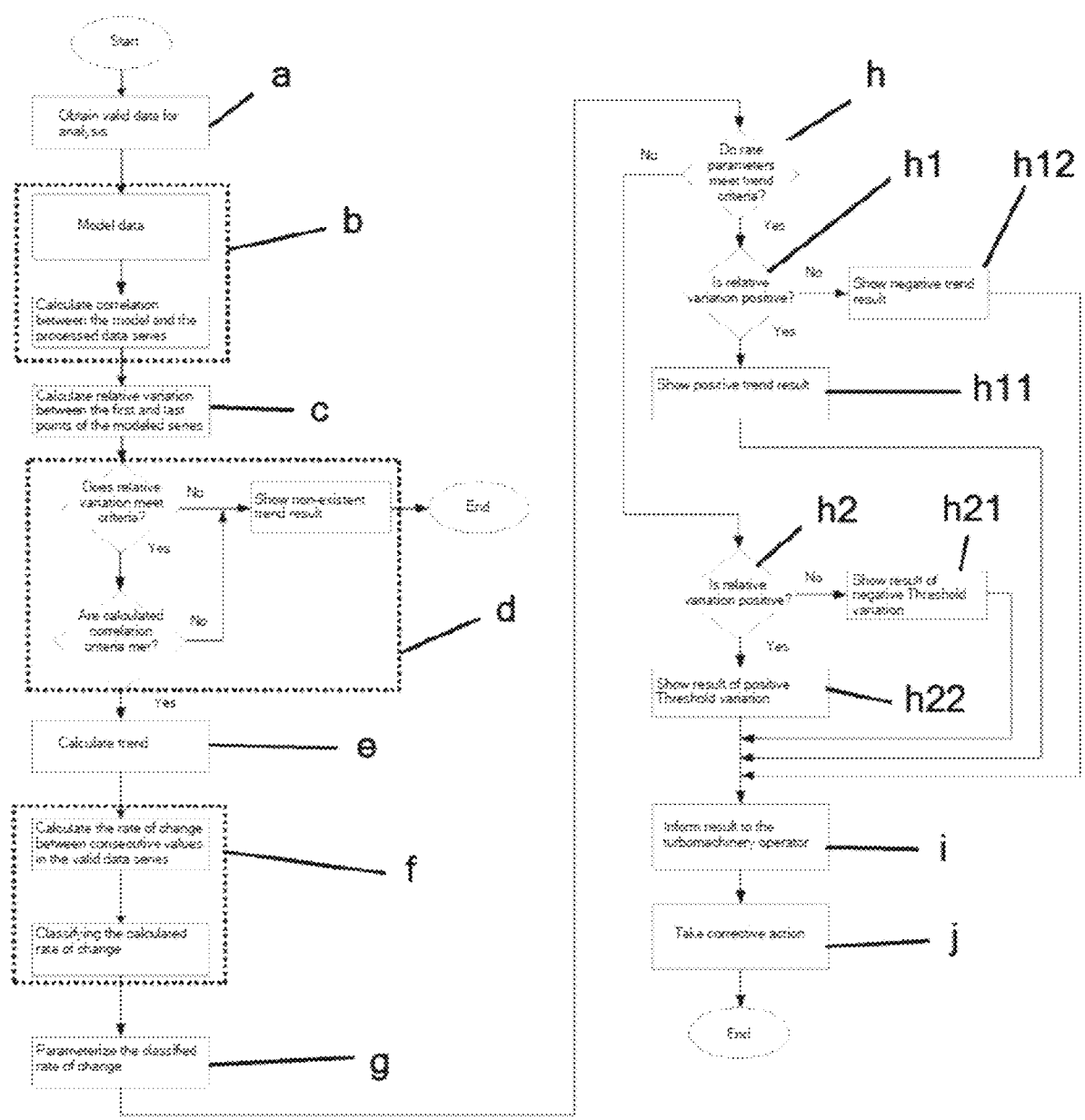
FIG. 2 illustrates a block diagram representative of the method for automatic determination of a trend in graphic analysis of turbomachinery of the present invention.

FIG. 2 shows a block diagram representative of the method for automatic determination of trends in graphic analysis of turbomachinery 1 of the present invention.

In general, when it starts, the method involves the following steps:
a) obtain valid data for analysis from sensors installed in turbomachinery 1;
b) apply fourth order polynomial regression and evaluate its correlation with the sample;
c) calculate the relative variation between the first and last points of the modeled series;
d) assess whether the levels of relative variation and relative correlation exceed a pre-established minimum level;
  d1) display a non-existent trend result, if the relative variation or the relative correlation does not exceed the minimum level previously established;
e) calculate the trend using weighted average calculation;
f) calculate and classify the rate of change between consecutive values in the valid data series;
g) determine parameters for the rate of change;
h) verify that the parameters of the rate of change meet trend criteria, in which:
  h1) if the rate of change parameters meet trend criteria, check if the relative variation is positive, where:
    h11) if the relative variation is positive, display a positive trend result; and
    h12) if the relative variation is negative, display a negative trend result,
  h2) if the rate of change parameters do not meet trend criteria, check if the relative variation is positive, where:
    h21) if the relative variation is negative, display a result that there is a negative threshold change; and
    h22) if the relative variation is positive, display a result that there is a positive threshold change,
i) inform the results calculated; and
j) take corrective action.

As described, after step d1, the method can be finalized, since no error trend was found.

It is important to note that the step i) informing the results obtained may include displaying information on a display or sending information to an automatic controller.

Thus, when the information is shown on a display, a technician can make the necessary changes to the turbomachinery. If the information is sent to an automatic controller, the controller will be able to automatically make changes to operation of the turbomachinery in accordance with the information. If desired, both options can be used.

In any case, failure of the turbomachinery due to changes made, can be avoided, either by the operator or by the automatic controller.

Thus, the invention solves the problems of the state of the art by providing an automated method for graphic analysis. The invention increases the efficiency of the graphic analysis by the operator, as the operator directs their efforts only to the variables that have some relevant behavior to be observed.

Variables that do not show any trend will not be analyzed, optimizing the operator's attention to the really important behavior of the variables under analysis.

Numerous variations affecting the scope of protection of this application are permitted. Thus, note the fact that the present invention is not limited to the particular configurations/consummations described above.

The invention claimed is:

1. A method for automatic determination of trends in graphic analysis of turbomachinery, the method comprising the steps of:
a) obtaining valid data for analysis from sensors installed in the turbomachinery;
b) applying fourth order polynomial regression and evaluating its correlation with the sample;
c) calculating the relative variation between the first and last points of the modeled series;
d) assessing whether the levels of relative variation and relative correlation exceed a pre-established minimum level;
  d1) displaying a non-existent trend result, if the relative variation or the relative correlation does not exceed the minimum level previously established;
e) calculating the trend using weighted average calculation;
f) calculating and classifying the rate of change between consecutive values in the valid data series;
g) determining parameters for the rate of change;
h) verifying that the parameters of the rate of change meet trend criteria, in which:
  h1) if the rate of change parameters meet trend criteria, checking if the relative variation is positive, where:
    h11) if the relative variation is positive, displaying a positive trend result; and
    h12) if the relative variation is negative, displaying a negative trend result, h2) if the rate of change parameters do not meet trend criteria, checking if the relative variation is positive, where:
    h21) if the relative variation is negative, displaying a result indicating a negative threshold change; and
    h22) if the relative variation is positive, displaying a result indicating a positive threshold change, i) informing the results obtained; and j) taking corrective action.

2. The method according to claim 1, wherein the step of i) informing the results obtained comprises displaying information on a display or sending information to an automatic controller.

3. The method according to claim 2, wherein the automatic controller performs changes in the operation of the turbomachine automatically according to the information received.

* * * * *